United States Patent [19]

Bearss et al.

[11] Patent Number: 4,675,083

[45] Date of Patent: Jun. 23, 1987

[54] COMPOUND BORE NOZZLE FOR INK JET PRINTHEAD AND METHOD OF MANUFACTURE

[75] Inventors: James G. Bearss; C. S. Chan; Wesley L. Meyer, all of Boise, Id.

[73] Assignee: Hewlett-Packard Company, Palo Alto, Calif.

[21] Appl. No.: 847,794

[22] Filed: Apr. 2, 1986

[51] Int. Cl.⁴ .............................................. C25D 1/08
[52] U.S. Cl. ..................................................... 204/11
[58] Field of Search ..................................... 204/11, 24

[56] References Cited

U.S. PATENT DOCUMENTS 4,246,076  1/1981  Gardner ................................. 204/11

*Primary Examiner*—T. M. Tufariello
*Attorney, Agent, or Firm*—William J. Bethurum

[57] ABSTRACT

The present invention is directed to a compound bore nozzle plate for a thermal ink jet printhead and is manufactured by electroforming nickel onto a nickel substrate which has been masked by a plurality of mask segments of predefined geometry. This geometry consists of a plurality of base segments upon which have been formed a corresponding plurality of post segments of greater vertical dimension and smaller lateral dimension than the base segments. This mask geometry enables greater center-to-center orifice spacing to be achieved without unacceptably reducing the thickness and structural integrity of the nozzle plate.

7 Claims, 7 Drawing Figures

COMPOUND BORE NOZZLE FOR INK JET PRINTHEAD AND METHOD OF MANUFACTURE

TECHNICAL FIELD

This invention relates generally to thermal ink jet printing and more particularly to an improved process for manufacturing a metal nozzle plate featuring improved orifice bore packing density and structural integrity.

BACKGROUND ART AND RELATED APPLICATION

In the field of thermal ink jet printing, it is known to provide metal orifice plates, such as those fabricated of electroplated nickel, in combination with thin film resistor (TFR) heater substrates in the construction of thermal ink jet printheads. The art of thermal ink jet printhead construction is relatively well developed and is disclosed, for example, in some detail in the *Hewlett Packard Journal*, Vol. 36, No. 5, May 1985 incorporated herein by reference. Electroformed nickel orifice plate structures are also disclosed in copending application Ser. No. 801,169 of C. S. Chan et al entitled "Improved Barrier Layer and Orifice Plate for Thermal Ink Jet Printhead Assembly and Method of Manufacture", filed Nov. 22, 1985 and assigned to the present assignee and also incorporated herein by reference.

In this copending application of Chan et al, there is disclosed and claimed an improved convergent nozzle geometry which greatly reduces the problem of gulping of the ink during an ink ejection operation and minimizes the attendant problems of cavitation wear and operational inefficiency produced by this gulping. However, it has been found that when employing the process of this copending Chan et al application, there is a trade-off between orifice packing density and orifice plate thickness. That is, for a given minimum exit diameter of the ink ejection orifice, a closer packing density or center-to-center spacing of the orifices would require a reduction in electroplating or electroforming thickness and structural integrity. This trade-off is usually undesirable, since a reduced orifice plate thickness will also mean a corresponding decrease in orifice bore thickness and this will in turn increase trajectory error of the ink drops. It is the solution to this latter problem to which the present invention is directed.

DISCLOSURE OF INVENTION

Accordingly, it is an object of this invention to provide a new and improved process for manufacturing ink ejection orifice plates having an improved orifice packing density.

Another object is to provide an improved orifice plate geometry which eliminates or reduces gulping of ink during an ink ejection operation.

Another object is to provide a new and improved orifice plate construction with improved structural integrity and an orifice bore thickness uncompromised by other improved structural features such as orifice packing density.

A feature of this invention is the provision of a metal orifice plate whose orifice exit diameter and bore thickness can be independently defined, thereby insuring acceptably high packing densities and ink ejection directionality.

These and other objects and features of this invention are achieved by providing a first mask on a metal substrate and including a first plurality of segments having a corresponding first predefined width, height and center-to-center spacing. Thereafter, a second mask is formed on top of the first mask and includes a second plurality of segments formed atop the first plurality of segments and having a second predefined width, height and center-to-center spacing. The second plurality of segments are smaller in lateral dimension and larger in vertical dimension than those of the first plurality of segments, so that the second plurality of segments are individually in the form of a post which sits atop the underlying first segment or island of larger lateral dimension.

This compound mask configuration allows the electroforming of a metal orifice plate around these segments, so that post segment of the mask enables a sufficiently thick ink ejection bore to be defined within the metal orifice plate, whereas the composite configuration of both the first and second segments enables the production of the high packing density convergent nozzle geometry sufficient to prevent or substantially eliminate gulping. Thus, the nozzle bore thickness and the center-to-center orifice spacing may be independently controlled in accordance with a desired nozzle plate geometry.

The above and other objects and novel features of this invention will become more fully apparent from the following description of the accompanying drawing.

BEST MODE FOR CARRYING OUT THE INVENTION

Figure 1:
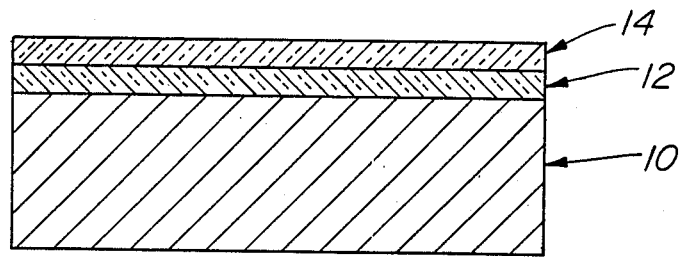
FIGS. 1 through 7 illustrate schematically a sequence of processing steps carried out in accordance with a presently preferred process embodiment of the invention.

Referring now to FIG. 1, there is shown a stainless steel substrate 10 which is typically 10 to 20 mils in thickness and which is coated with a thin layer 12 of polyimid of approximately 3 micrometers in thickness. This polyimid was deposited using conventional spin-on techniques and was of a type known as the PI2555 polyimid made available by the Dupont Company of Wilmington, Del. under the tradename PARALIN. In a subsequent processing step, a thin layer 14 of positive photoresist of approximately 3 to 5 microns in thickness was formed on the upper surface of the polyimid layer 12, and the photoresist layer 14 was type AZ4010 Shipley photoresist made available by the Shipley Company of Newton, Mass. These two steps forming layers 12 and 14 can be replaced by a one-step photo-definable polyimid or similar kind of photoresist that is compatible with all the subsequent processing described hereinafter.

Figure 2:
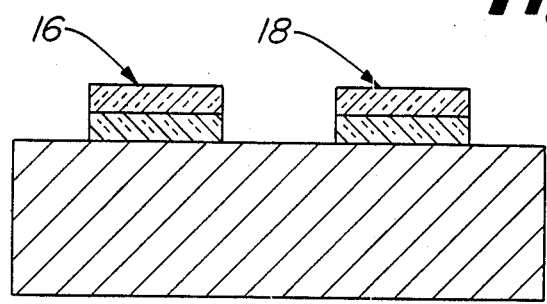
Figure 3:
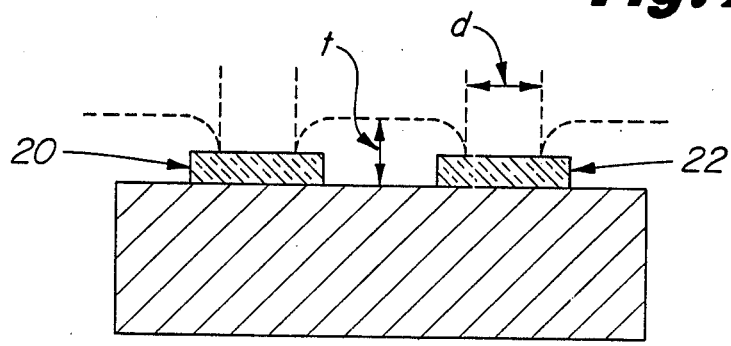

The layered structure of FIG. 1 was then transferred to a conventional photolithographic masking, UV exposure and etching station where the double layer islands 16 and 18 as indicated in FIG. 2 were formed in the geometry shown. Then the upper photoresist islands in FIG. 2 were washed away using a conventional photoresist stripper such as Shipley type AZ 351 DEV to leave the resultant masked structure shown in FIG. 3. In this structure, the polyimid islands 20 and 22 will typically have a center-to-center spacing in the range of about 1/150–1/200 of an inch and will typically be 5 mils across and about 3 micrometers in thickness.

Consider now the dotted line representation of the electroformed metal thickness limitation imposed by the earlier Chan et al process of application Ser. No. 801,169. If one is to maintain a minimum dimension d" in orifice diameter while trying to move the center lines of the islands 20 and 22 closer together for an increased and maximized orifice packing density, then the dimension "t" of metal layer thickness will have to be reduced. However, the reduction of "t" reduces the ultimate bore thickness of the nozzle plate and this in turn causes a loss in orifice plate integrity and directionality of ink ejected from the nozzle plate. Thus, an undesirable loss of ink droplet directionality and an unacceptable reduction in structural integrity of the orifice plate will occur if the dimension "t" is reduced below a certain threshold valve.

Figure 4:
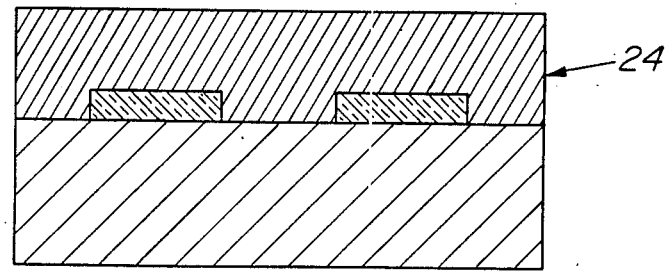

However, this problem is solved in accordance with the present invention by the provision of a negative photoresist layer 24 which is deposited on top of the islands of polyimid 20 and 22 to a thickness of approximately 2 mils as shown in FIG. 4. This negative photoresist is preferably one sold by the Dupont Company under the trade name RISTON. As will be appreciated by those skilled in the art, a negative photoresist is chosen because of its ability to be formed at much greater thicknesses than would be the case when using a positive photoresist layer atop a previously formed positive photoresist layer.

Figure 5:
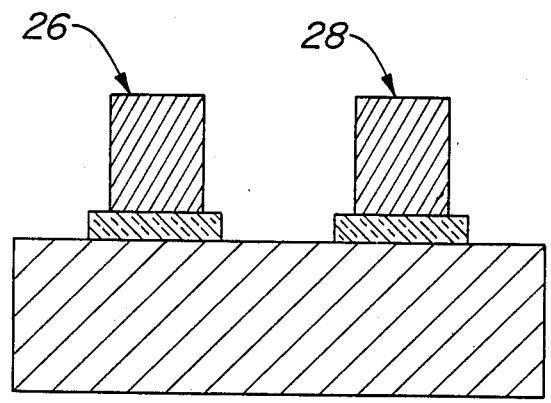

The structure of FIG. 4 is then transferred to conventional photoresist masking, development and etching station where the resist posts 26 and 28 are formed as second mask segments on the first or lower plurality of mask segments 20 and 22. With the second plurality of mask segments 26 and 28 now in place as shown in FIG. 5, the structure of FIG. 5 can now be transferred to an electroforming station wherein a layer of nickel 30 is formed on the exposed surfaces of FIG. 6 and in the geometry shown in FIG. 6 and to a thickness of typically 2.5 mils. This electroforming process may advantageously be of the type described in either the above Chan et al application Ser. No. 801,169 and also explained in more chemical detail in the above identified Hewlett-Packard Journal of May 1985.

Figure 6:
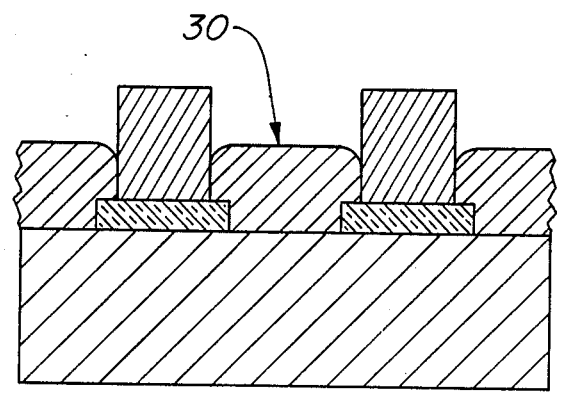
Figure 7:
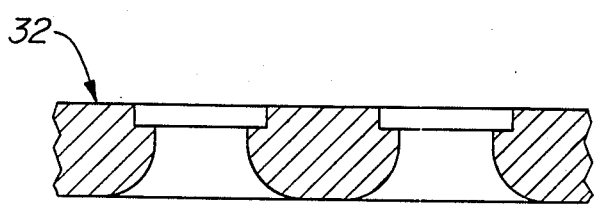

Once the orifice plate in FIG. 6 is completed to the 2.5 mil thickness as shown, the negative and positive photoresist mask segments are removed using conventional photoresist liftoff processes, carrying with them the stainless steel substrate or handle member 10 to thereby leave the resultant nozzle plate 32 shown in FIG. 7.

The present invention is not limited to the particular nozzle plate construction in FIG. 7, but instead may be combined with the additional electroforming steps such as those described in the Chan et al application Ser. No. 801,169 to form a further extension or second nickel layer which gives added nozzle plate thickness and structural integrity to the ultimate nozzle plate design.

Various modifications may be made in the above described embodiment without departing from the scope of this invention. For example, it is possible to provide the mask segments 20 and 22 in FIG. 3 using a one-step photodefinable polyimid or even a negative photoresist. One such negative photoresist is made available by the KTI Chemical Corporation under the trade name KTI-740. The Dupont Company is also capable of supplying the one-step photodefinable polyimid, but at the present time is doing so on a sample or prototype basis and no trade name or number is known at present.

INDUSTRIAL APPLICABILITY

This invention is used in the manufacture of thin film resistor type printheads used to control ink ejection in thermal ink jet printers.

We claim:

1. A process for manufacturing an orifice plate for an ink jet printhead and having a plurality of adjacent convergent orifices which comprises the steps of:
   a. providing a first mask on a metal substrate and including a first plurality of mask segments of a first predefined width, height and spacing,
   b. providing a second mask including a second plurality of segments formed atop said first plurality of segments and having a corresponding second predefined width, height and spacing which is smaller in lateral dimension and larger in vertical dimension than those corresponding dimensions of said first plurality of mask segments,
   c. electroplating or electroforming a selected metal material on the exposed surfaces of said metal substrate and having orifices of a contour dependent upon the contours of said first and second pluralities of said mask segments, and
   d. removing said mask segments and said substrate to thereby leave a metal orifice plate having curved contoured convergent orifices with center-to-center spacings independent of the thickness of said orifice plate.

2. A nozzle plate fabricated in accordance with the process of claim 1 wherein the center-to-center spacing of said orifices can be reduced to the range of between 1/150 of an inch and 1/200 of an inch and the thickness of said nozzle plate can be maintained on the order of about 2.5 mils.

3. The process defined in claim 1 wherein said first plurality of mask segments are a positive photoresist and said second plurality of mask segments are a negative photoresist, and said metal material is electroformed of nickel to a thickness on the order of about 2.5 mils or greater to thereby yield convergent nozzle geometries which reduce or eliminate gulping of ink during an ink ejection operation.

4. A process for fabricating an orifice plate of convergent orifice geometry and at a high orifice packing density independent of orifice plate thickness, including:
   a. forming a plurality of mask segments on the surface of a metal substrate, each segment comprising a flat base portion and a central post portion sitting atop said base portion and having a lateral dimension smaller than the lateral dimension of said base portion and a vertical dimension larger than the vertical dimension of said base portion,
   b. electroforming a metal on the exposed areas of said metal substrate to define a plurality of convergent orifice geometries around said mask segments,
   c. removing said mask segments and said metal substrate from the metal electroformed thereon, and thereby
   d. leaving a plurality of closely spaced orifices with major convergent contoured curved surfaces with center-to-center spacing independent of the thickness of said orifice plate.

5. The process defined in claim 4 wherein said flat base portion mask segment is a positive photoresist, said central post portion mask segment is a negative photoresist, and said metal electroformed on said substrate is nickel.

6. The process defined in claim 5 wherein the center-to-center spacing of said orifices is in the range of 1/150–1/200 inch and the thickness of said nozzle plate is on the order of about 2.5 mils.

7. A metal nozzle plate having orifice spacings in the range of 1/150–1/200 inch and a thickness of about 2.5 mils or greater and manufactured by the process of:
 a. forming a plurality of mask segments on the surface of a metal substrate, each segment comprising a flat base portion and a central post portion sitting atop said base portion and having a lateral dimension smaller than the lateral dimension of said base portion and a vertical dimension larger than the vertical dimension of said base portion,
 b. electroforming a metal on the exposed areas of said metal substrate to define a plurality of convergent orifice geometries around said mask segments, and
 c. removing said mask segments and said metal substrate from the metal electroformed thereon.

* * * * *